(12) United States Patent
Wang et al.

(10) Patent No.: US 12,048,137 B2
(45) Date of Patent: Jul. 23, 2024

(54) SEMICONDUCTOR ARRANGEMENT AND METHOD OF MANUFACTURE

(71) Applicant: TAIWAN SEMICONDUCTOR MANUFACTURING COMPANY LIMITED, Hsin-Chu (TW)

(72) Inventors: Po-Sheng Wang, Zhubei (TW); Ru-Yu Wang, New Taipei (TW); Yangsyu Lin, New Taipei (TW); You-Cheng Xiao, Taiping (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 416 days.

(21) Appl. No.: 17/404,260

(22) Filed: Aug. 17, 2021

(65) Prior Publication Data

US 2022/0302136 A1 Sep. 22, 2022

Related U.S. Application Data

(60) Provisional application No. 63/163,775, filed on Mar. 19, 2021.

(51) Int. Cl.
*H01L 23/00* (2006.01)
*H01L 21/02* (2006.01)
*H01L 21/8238* (2006.01)
*H01L 27/092* (2006.01)
*H01L 29/06* (2006.01)
*H01L 29/423* (2006.01)
*H01L 29/66* (2006.01)
*H01L 29/786* (2006.01)
*H10B 10/00* (2023.01)

(52) U.S. Cl.
CPC ......... *H10B 10/18* (2023.02); *H01L 21/0259* (2013.01); *H01L 21/823807* (2013.01); *H01L 27/0922* (2013.01); *H01L 29/0665* (2013.01); *H01L 29/42392* (2013.01); *H01L 29/66742* (2013.01); *H01L 29/78696* (2013.01)

(58) Field of Classification Search
CPC .. H10B 10/18; H01L 21/0259; H01L 29/0665
See application file for complete search history.

(56) References Cited

U.S. PATENT DOCUMENTS

2021/0311240 A1* 10/2021 Siddique .............. G02B 5/3058

* cited by examiner

*Primary Examiner* — Anthony Ho
(74) *Attorney, Agent, or Firm* — Cooper Legal Group, LLC

(57) ABSTRACT

A semiconductor arrangement includes a memory array including bitcells and a peripheral logic block for accessing the bitcells. The peripheral logic block includes a first nanostructure having a first width for providing power to a first logic unit of the peripheral logic block, and a second nanostructure axially aligned with the first nanostructure and having a second width less than the first width for providing power to a second logic unit of the peripheral logic block.

20 Claims, 12 Drawing Sheets

SEMICONDUCTOR ARRANGEMENT AND
METHOD OF MANUFACTURE

RELATED APPLICATION

This application claims priority to U.S. Provisional Application Ser. No. 63/163,775, titled "SEMICONDUCTOR ARRANGEMENT AND METHOD OF MANUFACTURE" and filed on Mar. 19, 2021, which is incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as gate all around (GAA) transistors. A GAA transistor comprises one or more nanosheet or nanowire channel regions having a gate wrapped around the nanosheet or nanowire. GAA transistors can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
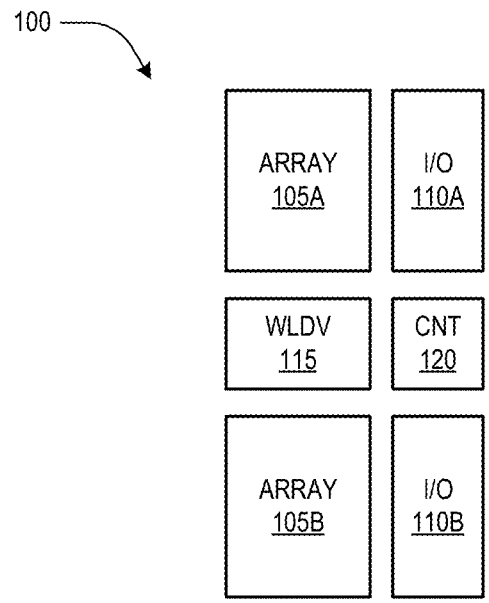
FIG. 1 is a block diagram of a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements and/or one or more techniques for fabricating one or more semiconductor arrangements are provided herein. In some embodiments, a semiconductor arrangement comprises a memory array and one or more peripheral logic blocks adjacent the memory array for accessing bitcells of the memory array. In some embodiments, a peripheral logic block comprises active region rows, and a ratio of active region rows to bitcells is 3:1. The specific ratio of 3 active region rows per bitcell is unique and allows a peripheral logic block to occupy a smaller footprint and moves logic devices formed in the peripheral logic block closer to the bitcells which, among other things, increases yield and/or performance, such as rate of access, reduced power consumed to access, etc., as compared to arrangements having an active region row to bitcell ratio of other than 3:1. In some embodiments, a first active region row has a first width, and a second active region row has a second width different than the first width. In some embodiments, the first active region row and the second active region row are axially aligned. In some embodiments, active region rows have different widths and/or pitches. Reducing the width of an active region row, among other things, reduces leakage current, which also increase performance.

Referring to FIG. 1, a block diagram of a semiconductor arrangement 100 is provided, according to some embodiments. In some embodiments, the semiconductor arrangement 100 comprises memory arrays 105A, 105B and input/output (I/O) blocks 110A, 110B for accessing bitcells in the memory arrays 105A, 105B. In some embodiments, the memory arrays 105A, 105B comprise synchronous random access memory (SRAM) bitcells. In some embodiments, the I/O blocks 110A, 110B are positioned along edges of the memory arrays 105A, 105B. In some embodiments, a word line driver (WLDV) block 115 is positioned between the memory arrays 105A, 105B for selecting rows of bitcells to access in the memory arrays 105A, 105B. In some embodiments, a control (CNT) block 120 is positioned between the I/O blocks 110A, 110B. In some embodiments, the I/O blocks 110A, 110B the WLDV block 115, and/or the CNT block 120 are referred to as peripheral logic blocks. Other structures and/or configurations of the memory arrays 105A, 105B, the I/O blocks 110A, 110B the WLDV block 115, and/or the CNT block 120 are within the scope of the present disclosure.

Figure 2:
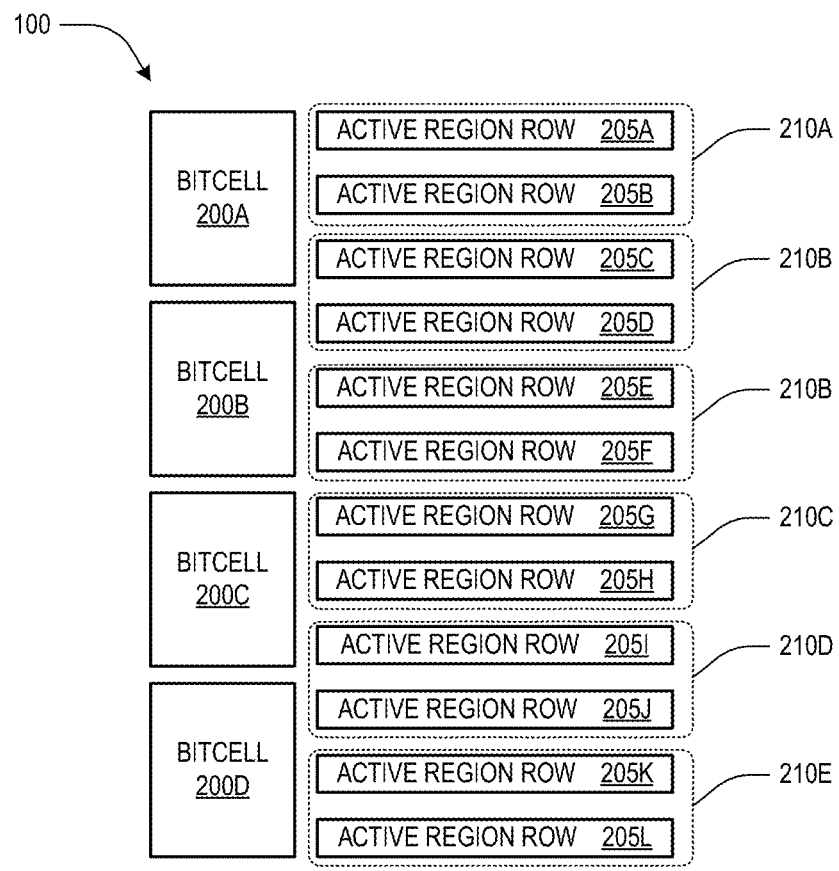
FIG. 2 is a block diagram illustrating an arrangement of bitcells and active region rows of peripheral logic blocks, in accordance with some embodiments.

Referring to FIG. 2, a block diagram illustrating an arrangement of bitcells 200A, 200B, 200C, 200D and active region rows 205A, 205B, 205C, 205D, 205E, 205F, 205G, 205H, 205I, 205J, 205K, 205L of peripheral logic blocks 210A, 210B, 210C, 210D, 210E. In some embodiments, one or more of the bitcells 200A, 200B, 200C, 200D are part of a memory array, such as memory array 105A and/or memory array 105B of FIG. 1. In some embodiments, one or more of the peripheral logic blocks 210A, 210B, 210C, 210D, 210E are part of the CNT block 120, the I/O block 110A, the I/O block 110B, and/or the WLDV block 115 of FIG. 1. In some embodiments, the active region rows are formed by patterning, such as by etching, a nanostructure layer. In some embodiments, one or more of the peripheral logic blocks 210A, 210B, 210C, 210D, 210E comprise two active region rows 205A, 205B, 205C, 205D, 205E, 205F, 205G, 205H, 205I, 205J, 205K, 205L. In some embodiments, one or more of the peripheral logic blocks 210A, 210B, 210C, 210D, 210E is said to be a logic unit of a larger peripheral logic block made up of multiple peripheral logic blocks. In some embodiments, one or more of the active region rows 205A, 205B, 205C, 205D, 205E, 205F, 205G, 205H, 205I, 205J, 205K, 205L are configured to implement a peripheral logic circuit used to access one or more of the bitcells 200A, 200B, 200C, 200D, such as to read from and/or write to the bitcells. In some embodiments, some portions of one or more of the active region rows 205A, 205B, 205C, 205D, 205E, 205F, 205G, 205H, 205I, 205J, 205K, 205L are configured as logic devices, while other portions of one or more of the active region rows 205A, 205B, 205C, 205D, 205E, 205F, 205G, 205H, 205I, 205J, 205K, 205L are configured as power headers for providing power to the logic devices.

In some embodiments, one or more of the active region rows 205A, 205B, 205C, 205D, 205E, 205F, 205G, 205H, 205I, 205J, 205K, 205L comprise nanostructure devices. As used herein, nanostructure devices refer to devices comprising nanostructures that are substantially flat, nearly two-dimensional structures, such as sometimes referred to as comprising nanosheets and/or nanowires. In some embodiments, nanostructures have rectangular cross-sections. In some embodiments, nanostructures have elliptical cross-sections. In some embodiments, one or more of the active region rows 205A, 205B, 205C, 205D, 205E, 205F, 205G, 205H, 205I, 205J, 205K, 205L comprise finFET devices. In some embodiments, one or more of the active region rows 205A, 205B, 205C, 205D, 205E, 205F, 205G, 205H, 205I, 205J, 205K, 205L comprise planar devices. Other structures and/or configurations of the active region rows 205A, 205B, 205C, 205D, 205E, 205F, 205G, 205H, 205I, 205J, 205K, 205L are within the scope of the present disclosure.

In some embodiments, a ratio of active region rows 205A, 205B, 205C, 205D, 205E, 205F, 205G, 205H, 205I, 205J, 205K, 205L to bitcells 200A, 200B, 200C, 200D is 3:1. The 3:1 ratio of active region rows 205A, 205B, 205C, 205D, 205E, 205F, 205G, 205H, 205I, 205J, 205K, 205L to bitcells 200A, 200B, 200C, 200D allows the peripheral logic block 210A, 210B, 210C, 210D, 210E to occupy a smaller footprint and moves logic devices formed in the peripheral logic block 210A, 210B, 210C, 210D, 210E closer to the bitcells 200A, 200B, 200C, 200D which, among other things, increases yield and/or performance, such as rate of access, reduced power consumed to access, etc., as compared to arrangements that do not have an active region row to bitcell ratio of 3:1.

Figure 3:
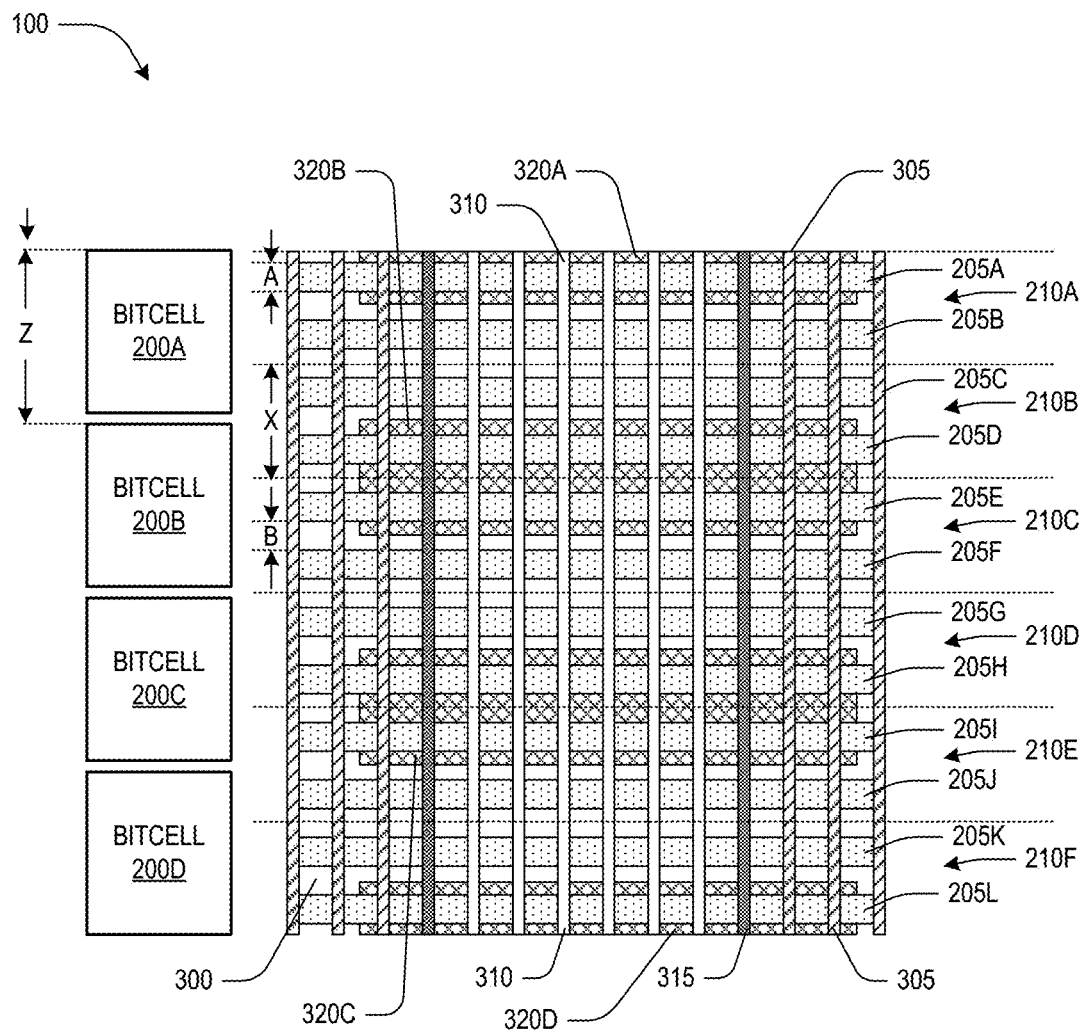
FIG. 3 is a top view of a semiconductor arrangement, in accordance with some embodiments.

Referring to FIG. 3, a top view of the semiconductor arrangement 100 is provided, according to some embodiments. The semiconductor arrangement 100 comprises a semiconductor layer 300 over which the active region rows 205A, 205B, 205C, 205D, 205E, 205F, 205G, 205H, 205I, 205J, 205K, 205L are formed. An array of gate structures, including dummy gate structures 305, active gate structures 310, and diffusion break structures 315 is formed over the active region rows 205A, 205B, 205C, 205D, 205E, 205F, 205G, 205H, 205I, 205J, 205K, 205L. In some embodiments, the dummy gate structures 305 are non-functional, but are provided to keep the distribution of gate structures 305, 310, 315 uniform over the active region rows 205A, 205B, 205C, 205D, 205E, 205F, 205G, 205H, 205I, 205J, 205K, 205L, thereby tending to increase yield, facilitate desired performance, etc. In some embodiments, a width, A, of the active region rows 205A, 205B, 205C, 205D, 205E, 205F, 205G, 205H, 205I, 205J, 205K, 205L is approximately equal to a spacing, B between the active region rows 205A, 205B, 205C, 205D, 205E, 205F, 205G, 205H, 205I, 205J, 205K, 205L. The uniform width and spacing also tends to increase yield, facilitate desired performance, etc. Based on the width, A, and spacing, B, a peripheral logic block 210A, 210B, 210C, 210D, 210E has a dimension, X, equal to approximately 2A+2B. In some embodiments, a pitch, Z, of the bitcells 200A, 200B, 200C, 200D is about 195-252 nm. In some embodiments, the dimension, A, is about 13-45 nm. In some embodiments, the dimension, B, is about 39-52 nm. In some embodiments, the dimension, X, is about 13-168 nm. Other values, ranges, etc. of A, B, X, and/or Z are within the scope of the present disclosure.

In some embodiments, one or more of the active gate structures 310 are part of functional transistors defined by portions of one or more of the active region rows 205A, 205B, 205C, 205D, 205E, 205F, 205G, 205H, 205I, 205J, 205K, 205L. In some embodiments, gate cuts (not shown) are defined in one or more of the active gate structures 310 to define separate transistor devices. In some embodiments, the diffusion break structures 315 define diffusion breaks in the active region rows 205A, 205B, 205C, 205D, 205E, 205F, 205G, 205H, 205I, 205J, 205K, 205L to electrically isolate different transistor devices.

In some embodiments, the dummy gate structures 305 and/or the active gate structures 310 are replacement gate structures that were formed by replacing initially formed sacrificial gate structures comprising sacrificial gate dielectrics and sacrificial gate electrodes with replacement gate dielectrics and replacement gate electrodes. In some embodiments, a dielectric layer is formed over the sacrificial gate structures prior to the formation of the replacement gate structures. In some embodiments, a replacement gate dielectric comprises a high-k dielectric material. As used herein, "high-k dielectric" refers to a material having a dielectric constant, k, greater than or equal to about 3.9, which is the k-value of $SiO_2$. Examples of high-k dielectric materials include, but are not limited to, $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, La$_2$O$_x$N$_y$, TiO$_x$N$_y$, SrTiO$_x$N$_y$, LaAlO$_x$N$_y$, Y$_2$O$_x$N$_y$, SiON, SiN$_x$, a silicate thereof, an alloy thereof and/or other suitable materials. Each value of x is independently from 0.5 to 3, and each value of y is independently from 0 to 2. Other values, ranges, etc. of x and/or y are within the scope of the present disclosure. In some embodiments, a replacement gate dielectric comprises a native oxide formed by exposure of the semiconductor arrangement 100 to oxygen at various points in a fabrication process, causing the formation of silicon dioxide on exposed surfaces. In some embodiments, an additional dielectric material, such as comprising silicon dioxide, a high-k dielectric material, and/or other suitable materials, is formed over the native oxide to form the replacement gate dielectric.

In some embodiments, a replacement gate electrode comprises a barrier layer, one or more work function material layers, a seed layer, a metal fill layer, and/or other suitable layers. In some embodiments, the metal fill layer comprises tungsten, aluminum, copper, cobalt, and/or other suitable materials. In some embodiments, the gate dielectric layer and/or the one or more layers that comprise the gate electrode are formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques.

In some embodiments, a diffusion break structure 315 is formed by replacing a sacrificial gate structure material with a dielectric material. In some embodiments, portions of the active region rows 205A, 205B, 205C, 205D, 205E, 205F, 205G, 205H, 205I, 205J, 205K, 205L under the diffusion break structures 315 are replaced with a dielectric material to isolate the portions of the active region rows 205A, 205B, 205C, 205D, 205E, 205F, 205G, 205H, 205I, 205J, 205K, 205L on either side of the diffusion break structures 315 from one another. In some embodiments, one or more of the diffusion break structures 315 are parallel to one or more of the active gate structures 310 and/or one or more of the dummy gate structures 305.

In some embodiments, one or more portions of one or more of the active region rows 205A, 205B, 205C, 205D, 205E, 205F, 205G, 205H, 205I, 205J, 205K, 205L are configured to implement functional transistor devices. Example functional transistor devices include power header transistors to provide power supply signals to other devices, well strap transistors to tie source/drain regions to well regions, pull-up transistors, pull-down transistors, logic devices, and/or other suitable devices.

In some embodiments, portions of one or more of the active region rows 205A, 205B, 205C, 205D, 205E, 205F, 205G, 205H, 205I, 205J, 205K, 205L are arranged in complementary pairs. For example, well regions 320A, 320B, 320C, 320D are formed in the semiconductor layer 300. In some embodiments, the semiconductor layer 300, such as a silicon substrate, is doped with a dopant having a first conductivity type, and the well regions 320A, 320B, 320C, 320D are portions of the semiconductor layer 300 doped with a dopant having an opposite conductivity type. For example, the semiconductor layer 300 may be doped with an n-type dopant and the well regions 320A, 320B, 320C, 320D may be doped with a p-type dopant, or vice versa. Referring to the peripheral logic block 210A, the portion of the active region row 205A over the well region 320A forms a complementary pair with the portion of the active region row 205B formed over the semiconductor layer 300. Complementary pairs can be used to implement logic devices, such as inverters, logic gates, latches, and/or other suitable devices.

In some embodiments, a lithography process used to form the well regions 320A, 320B, 320C, 320D has size constraints such that a single well region spans two active region rows 205A, 205B, 205C, 205D, 205E, 205F, 205G, 205H, 205I, 205J, 205K, 205L. As seen in FIG. 3, adjacent peripheral logic blocks 210A, 210B, 210C, 210D, 210E are mirror images of each other to allow the well regions 320A, 320B, 320C, 320D to span two active region rows 205A, 205B, 205C, 205D, 205E, 205F, 205G, 205H, 205I, 205J, 205K, 205L. The well regions 320A, 320D have the same size as the well regions 320B, 320C, but portions (not shown) of the well regions 320A, 320D extend in the vertical direction into adjacent peripheral logic blocks (not shown).

Figure 4:
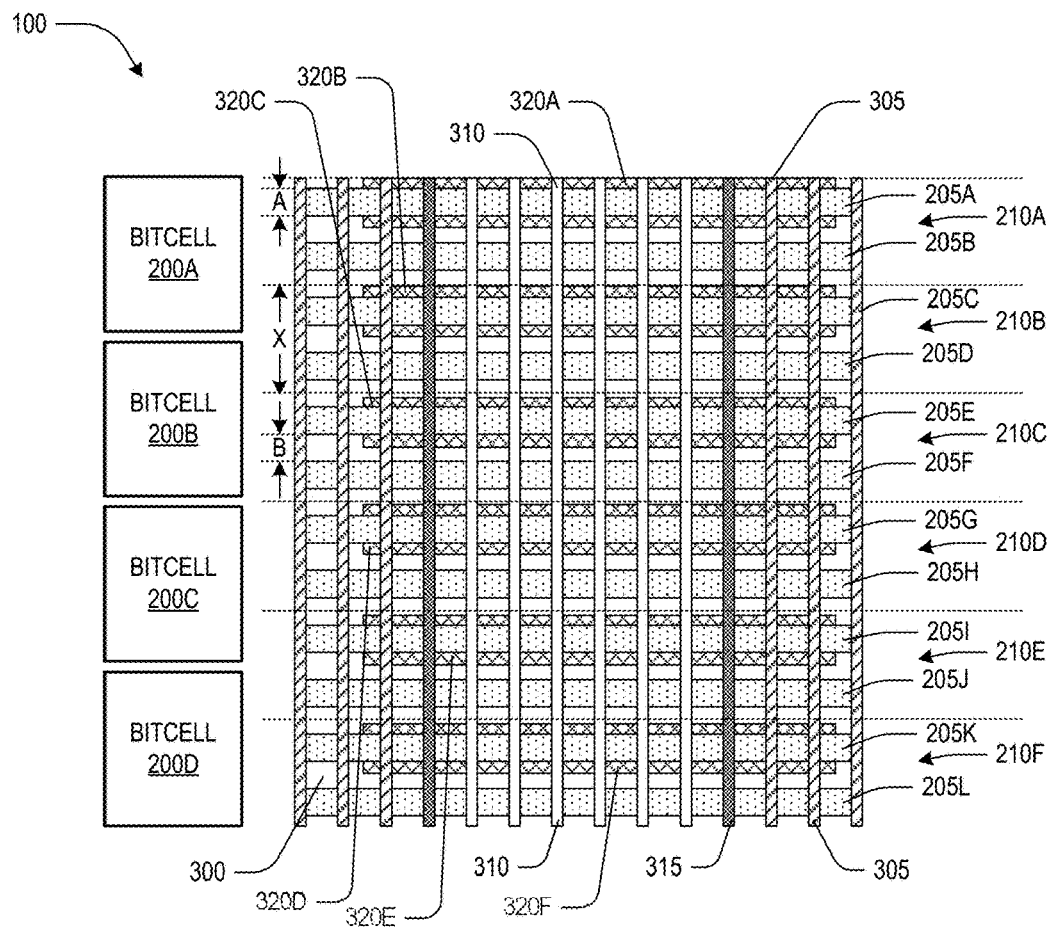
FIG. 4 is a top view of a semiconductor arrangement, in accordance with some embodiments.

Referring to FIG. 4, a top view of the semiconductor arrangement 100 is provided, according to some embodiments. The arrangement in FIG. 4 is similar to the arrangement in FIG. 3, but the well regions 320A, 320B, 320C, 320D, 320E, 320F in FIG. 4 span a single active region row 205A, 205C, 205E, 205G, 205I, 205K, whereas at least some of the well regions 320B, 320C in FIG. 3 span two active region rows 205D, 205E, 205H, 205I. In some embodiments, a lithography process with finer resolution, such as extreme ultraviolet light (EUV) lithography, is capable of patterning masks to facilitate well regions 320A, 320B, 320C, 320D, 320E, 320F to span a single active region row 205A, 205C, 205E, 205G, 205I, 205K, respectively. As compared to the well regions spanning two active region rows illustrated in FIG. 3, a well region 320A, 320B, 320C, 320D, 320E, 320F spanning a single active region row 205A, 205C, 205E, 205G, 205I, 205K increases active region area for functional devices. For example, well-strap transistors are commonly provided to the source/drain region of a functional transistor to an adjacent well region. An n-well strap connects the associated well region to a positive voltage supply, $V_{DD}$, and a p-well strap ties the semiconductor layer 300 to a reference voltage supply, $V_{SS}$. In an embodiment with well regions spanning two active region rows two well-strap transistors are required. In contrast, well regions 320A, 320B, 320C, 320D, 320E, 320F spanning single active region rows 205A, 205C, 205E, 205G, 205I, 205K allow for a single well strap transistor for each functional transistor, as illustrated in FIG. 4. For example, a portion of the active region row 205A over the well region 320A may define a p-type transistor, a portion of the active region row 205B over the semiconductor layer 300 may define an n-type transistor, a portion of the active region row 205C over the well region 320B may define an n-well strap for the semiconductor layer 300, and a portion of the active region row 205D over the semiconductor layer 300 may define a p-well strap for the well regions 320B, 320C. The pattern of functional devices and well strap devices may repeat for the remaining active region rows.

Figure 5:
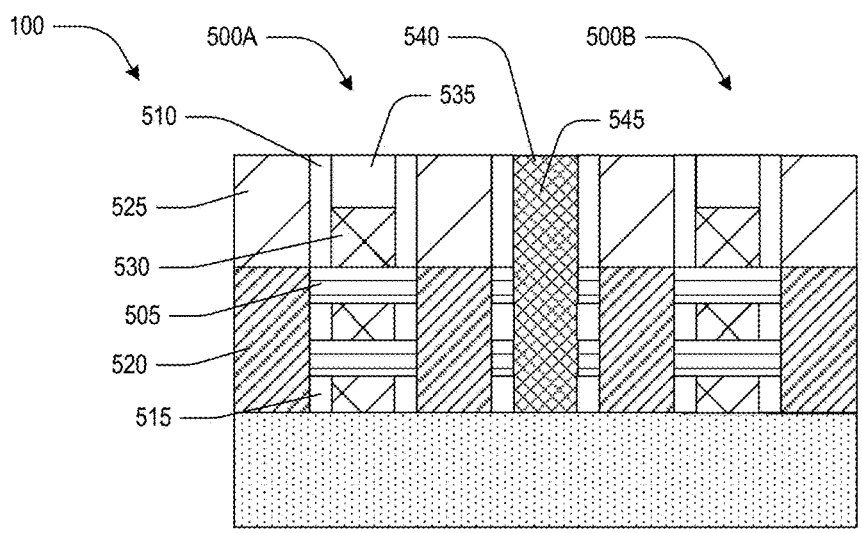
FIG. 5 is a cross-section view of a semiconductor arrangement, in accordance with some embodiments.

Referring to FIG. 5, one or more of the active region rows 205A, 205B, 205C, 205D, 205E, 205F, 205G, 205H, 205I, 205J, 205K, 205L comprise nanostructure based transistors 500A, 500B, according to some embodiments. Nanostructure is used herein to refer to substantially flat, nearly two-dimensional structures, such as sometimes referred to as comprising nanosheets and/or nanowires. In some embodiments, the transistors 500A, 500B are formed by forming a stack of alternating channel semiconductor layers 505 and sacrificial semiconductor layers. In some embodiments, the materials of the channel semiconductor layers 505 are different than the materials of the sacrificial semiconductor layers to provide etch selectivity and thereby allow removal of the sacrificial semiconductor layers while removing little to none of the channel semiconductor layers 505, or vice versa. In some embodiments, the channel semiconductor layers 505 comprise substantially pure silicon, and the sacrificial semiconductor layers comprise silicon-germanium ($Si_xGe_{(1-x)}$ where x ranges from 0.25 to 0.85). In some embodiments, the number of channel semiconductor layers 505 and sacrificial semiconductor layers is more than two. In some embodiments, the thicknesses of the channel semiconductor layers 505 and the sacrificial semiconductor layers vary, and the thicknesses need not be the same.

Sacrificial gate structures are formed over the stack of channel semiconductor layers for use in a gate replacement process, as described above. In some embodiments, sidewall spacers 510 are formed adjacent the sacrificial gate structures. The sidewall spacers 510 are formed by depositing a conformal spacer layer over the sacrificial gate structures and performing an anisotropic etch process to remove portions of the spacer layer positioned on horizontal surfaces. The sidewall spacers 510 comprise nitrogen, silicon, and/or other suitable materials. The channel semiconductor layers 505 and the sacrificial semiconductor layers are etched using the sidewall spacers 510 and the sacrificial gate structures as an etch mask. End spacers 515 are formed adjacent ends of the sacrificial semiconductor layers by selectively recessing the sacrificial semiconductor layers and forming a dielectric material in the recesses. Source/drain regions 520 are formed, and a dielectric layer 525 is formed over the source/drain regions 520. The dielectric layer 525 comprises Si, O, C, H, polymers, organo-silicate glass, a porogen-containing material, and/or other suitable materials. In some embodiments, the end spacers 515 comprise the same material composition as the sidewall spacers 510. In some embodiments, the source/drain regions 520 are formed, such as by an epitaxial growth process, after forming the sacrificial gate structures and/or after forming the end spacers 515.

In some embodiments, the sacrificial gate electrode materials are removed to define gate cavities between the sidewall spacers 510 and expose portions of the channel semiconductor layers 505 and the sacrificial semiconductor layers. An etch process is performed to remove the sacrificial semiconductor layers to define intermediate cavities between the channel semiconductor layers 505. In some embodiments, gate structures 530 are formed in the gate cavities and intermediate cavities. In some embodiments, the gate structures 530 comprise a gate dielectric and a gate electrode over the gate dielectric. The gate structures 530 are recessed and cap layers 535 are formed over the gate structures 530, in accordance with some embodiments. In some embodiments, the gate structures 530 are recessed using an etch process, and the cap layers 535 are formed using a deposition process. The cap layers 535 comprise silicon, nitrogen, oxygen, and/or other suitable materials. In some embodiments, the gate structures 530 correspond to the active gate structures 310 in FIGS. 3, 4, 10, 11.

In some embodiments, a diffusion break structure 540 is formed between the nanostructure based transistors 500A, 500B. In some embodiments, the diffusion break structure 540 is formed by removing the sacrificial gate structure, the channel semiconductor layers 505, and the sacrificial semiconductor layers to define a diffusion break cavity. In some embodiments, a dielectric material 545 is formed in the diffusion break cavity to electrically isolate the nanostructure based transistors 500A, 500B from one another. In some embodiments, the diffusion break structure 540, corresponds to the diffusion break structure 315 in FIGS. 3, 4, 10, 11.

Figure 6:
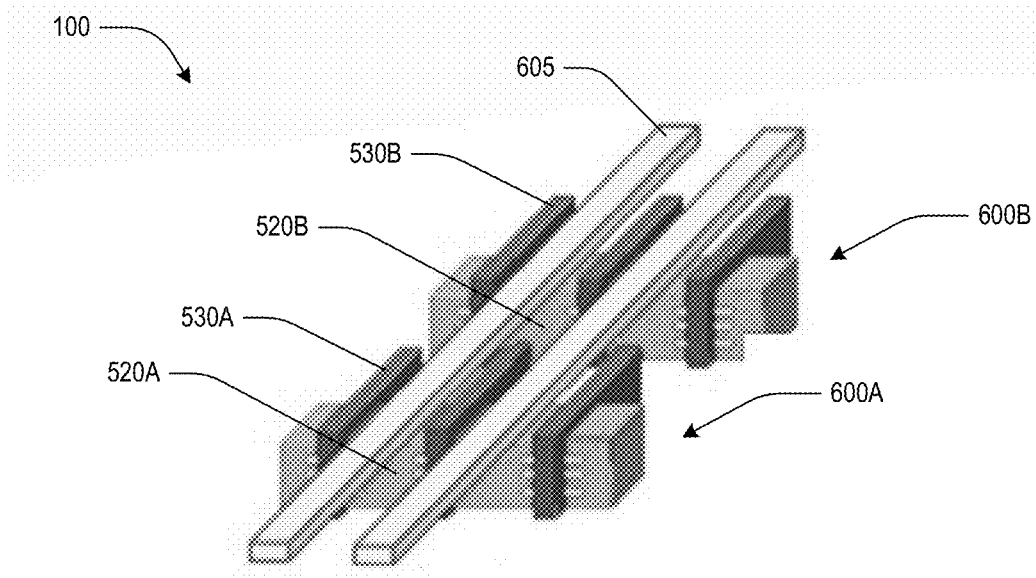
FIG. 6 is an isometric view of a semiconductor arrangement, in accordance with some embodiments.

FIG. 6 is a perspective view illustrating interconnections between transistors 600A, 600B in the semiconductor arrangement 100, where the transistors 600A, 600B are implemented via one or more adjacent active region rows 205A, 205B, 205C, 205D, 205E, 205F, 205G, 205H, 205I, 205J, 205K, 205L, according to some embodiments. The transistor 600A comprises a power header transistor and the transistor 600B comprises a logic transistor that receives power from the transistor 600A. A source/drain contact 605 connects the source/drain region 520A of the transistor 600A to the source/drain region 520B of the transistor 600B. In response to an enable signal on the gate structure 530A of the transistor 600A, a power supply signal, such as $V_{DD}$, is provided to the transistor 600B by the source/drain contact 605. The gate structure 530B of the transistor 600B may be controlled based on an input signal, such as from the adjacent memory array 105A, 105B, to implement a function for accessing the memory array 105A, 105B. In some embodiments, the source/drain contact 605 is formed in a device layer of the semiconductor arrangement 100. An additional source/drain contact is illustrated in FIG. 6 and functions in a similar manner as source/drain contact 605.

Figure 7:
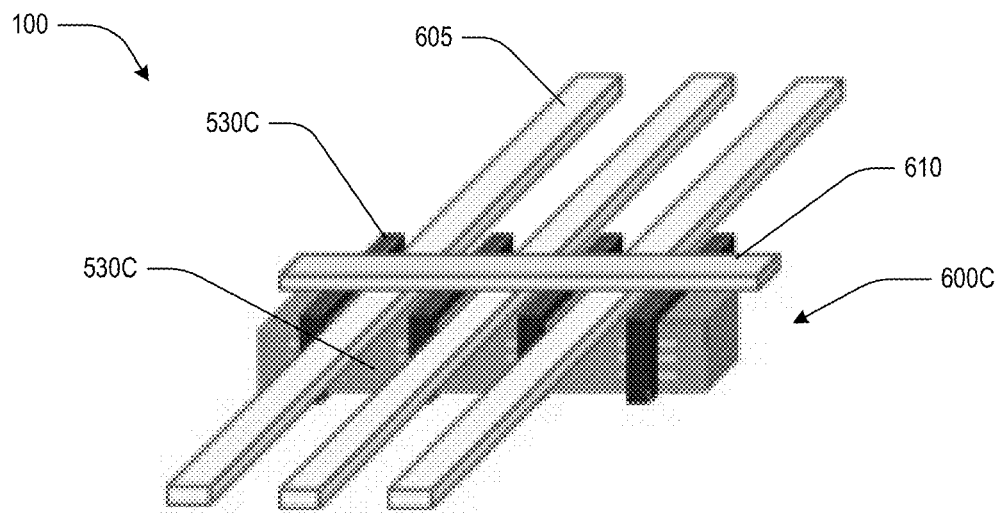
FIG. 7 is an isometric view of a semiconductor arrangement, in accordance with some embodiments

FIG. 7 is a perspective view illustrating a transistor 600C functioning as a power header transistor in the semiconductor arrangement 100, where the transistor 600C is implemented via one or more of the active region rows 205A, 205B, 205C, 205D, 205E, 205F, 205G, 205H, 205I, 205J, 205K, 205L, according to some embodiments. In contrast to FIG. 6, where the power header transistor 600A is immediately adjacent the logic transistor 600B, in FIG. 7 the logic transistor (not shown) powered by the transistor 600C is not implemented via an immediately adjacent active region row 205A, 205B, 205C, 205D, 205E, 205F, 205G, 205H, 205I, 205J, 205K, 205L. A conductive line 610 is coupled to the source/drain contact 605 of the transistor 600C. In response to an enable signal on the gate structure 530C of the transistor 600C, a power supply signal, such as $V_{DD}$, is provided to the logic transistor by the source/drain contact 605 and the conductive line 610. In some embodiments, the source/drain contact 605 is formed in a device layer of the semiconductor arrangement 100, and the conductive line 610 is formed in a metallization layer of the semiconductor arrangement 100, such as a M0 metallization layer. As compared to the arrangement of FIG. 6, where the transistors 600A, 600B are interconnected via the source/drain contact 605 in the device layer, the power distribution provided by the arrangement in FIG. 7 utilizes an additional layer, since the interconnection is provided via the conductive line 610 in the first metallization layer over the device layer. In the arrangement of FIG. 6, the transistor 600A serving as the power header for the transistor 600B is closer to the transistor 600B, thereby potentially improving performance.

Figure 8:
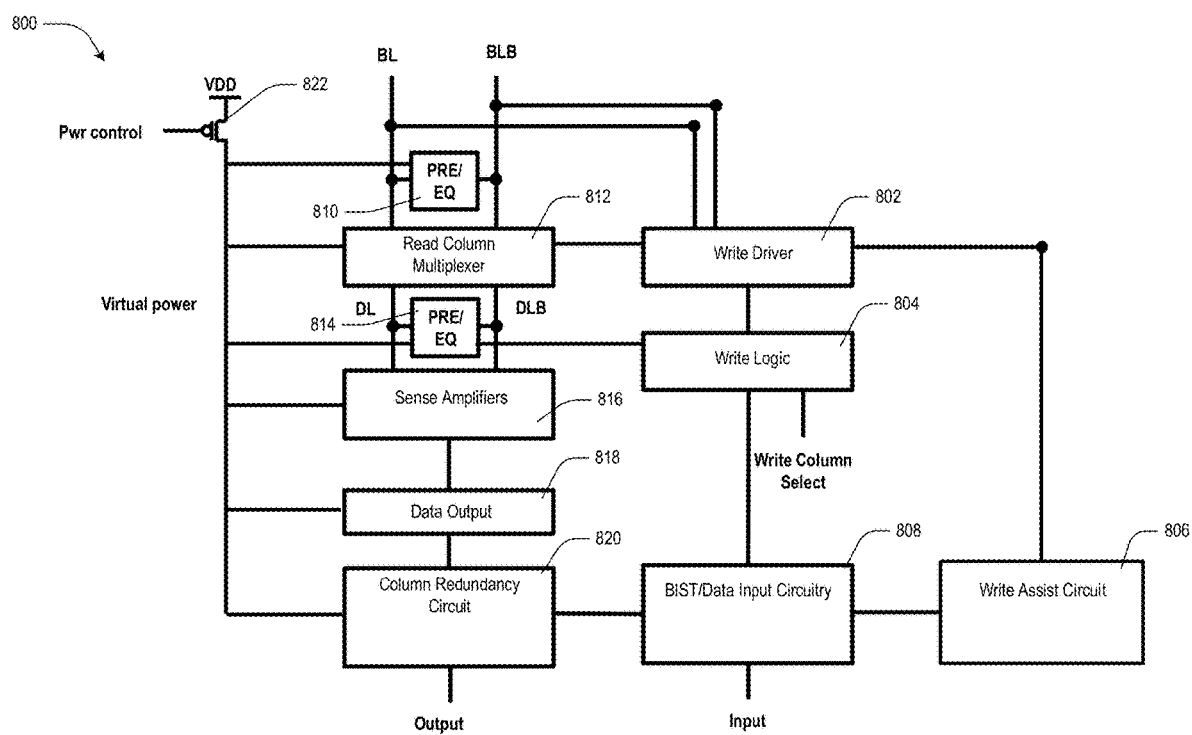
FIG. 8 is a block diagram of a peripheral logic circuit for accessing a memory array, in accordance with some embodiments.

Referring to FIG. 8, a block diagram of a peripheral logic circuit 800 for accessing one or more portions of the memory array 105A and/or 105B of FIG. 1 is provided, according to some embodiments. The peripheral logic circuit 800 includes devices for reading from and/or writing to one or more portions of the memory array 105A and/or 105B. In some embodiments, the peripheral logic circuit 800 comprises write driver circuitry 802 connected to bitlines BL, BLB for writing data into a bitcell, write logic 804, a write assist circuit 806, built-in self-test (BIST)/data input circuitry 808, a pre-charge/equalization circuit 810 coupled to the bitlines, a read column multiplexer 812, a pre-charge/equalization circuit 814 coupled to data lines of the bitcell (DL, DLB), sense amplifiers 816, data output circuitry 818, a column redundancy circuit 820, and power headers 822 for providing power to the various units in the peripheral logic circuit 800. In some embodiments, the pre-charge/equalization circuits 810, 814 pre-charge and equalize the voltages on the respective bitlines or data lines after every read/write cycle to prepare for the next read/write process. In some embodiments, the read column multiplexer 812 selects the bitlines for readout to the sense amplifiers 816. Other structures and configurations of the peripheral logic circuit 800 are within the scope of the present disclosure.

Figure 9:
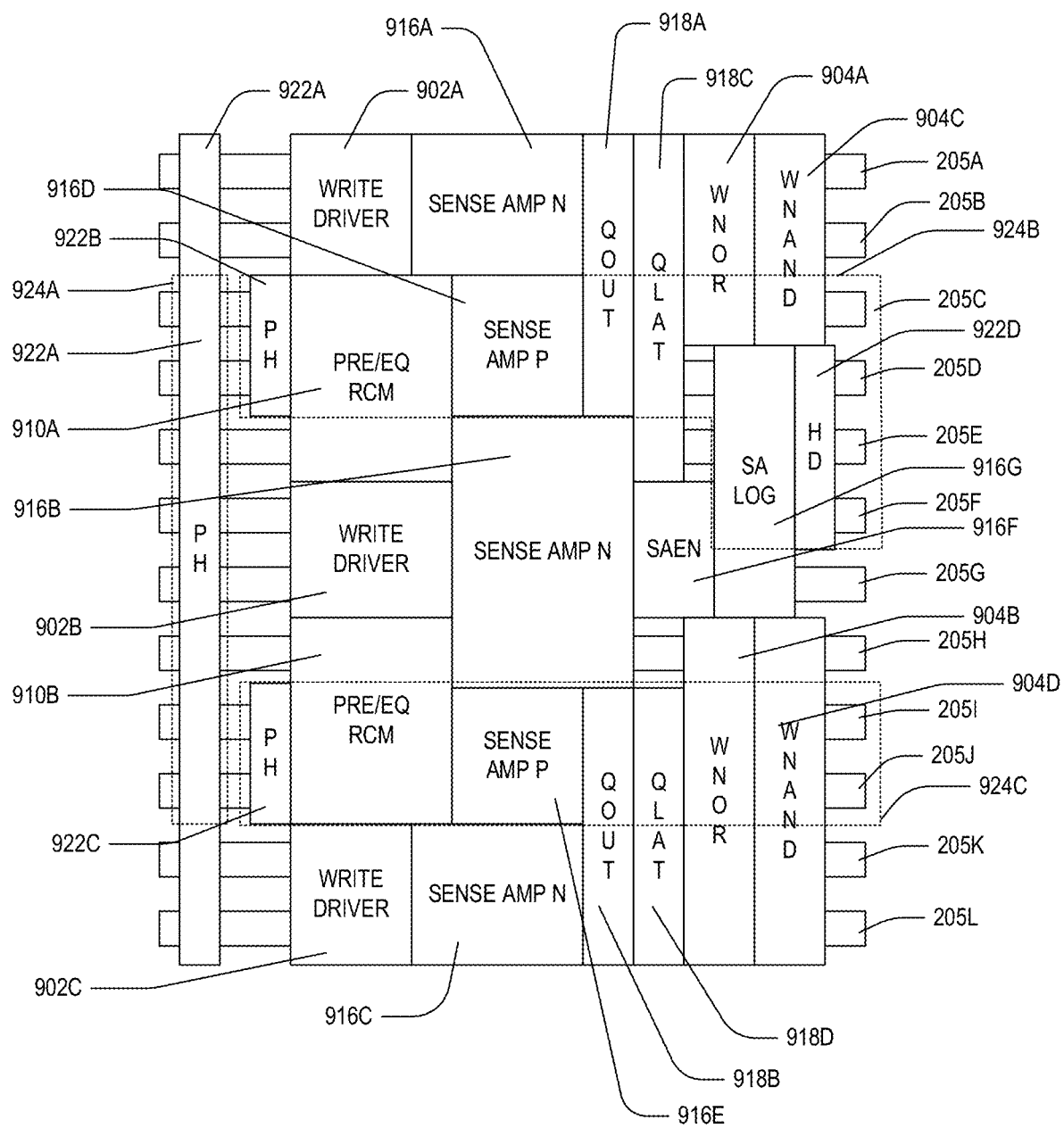
FIG. 9 is a layout diagram of a peripheral logic circuit for accessing a memory array, in accordance with some embodiments.

Referring to FIG. 9, a diagram of a layout 900 of portions of the peripheral logic circuit 800, including the write driver circuitry 802, the pre-charge/equalization circuits 810, 814, the read column multiplexer 812, the sense amplifiers 816, the data output circuitry 818, and the power headers 822, is provided, according to some embodiments. In some embodiments, the write driver circuitry 802 comprises write drivers 902A, 902B, 902C. In some embodiments, the write logic 804 comprises write NOR (WNOR) logic 904A, 904B for selecting the write column being accessed and write NAND (WNAND) logic 904C, 904D that provides data assertion for the write drivers 902A, 902B, 902C. In some embodiments, the pre-charge/equalization circuits 810, 814 and read column multiplexer 812 are represented by PRE/EQ RCM blocks 910A, 910B. In some embodiments, the sense amplifiers 816 comprise complementary circuits including sense amp n-type devices (SENSE AMP N) 916A, 916B, 916C and sense amp p-type devices (SENSE AMP P) 916D, 916E, a sense amplifier enable (SAEN) device 916F, such as a current source for enabling the sense amplifiers 816, and sense amplifier logic (SALOG) 916G for controlling the sense amplifiers 816. In some embodiments, the data output circuitry 818 comprises output data drivers (QOUT) 918A, 918B and data output latches (QLAT) 918C, 918D for maintaining the values of the output data. In some embodiments, the power headers 822 comprise a power header 922A associated with the write drivers 902A, 902B, 902C, power headers 922B, 922C associated with the pre-charge/equalization circuits 810 in the PRE/EQ RCM blocks 910A, 910B, and a power header 922D associated with the sense amplifier logic 916G. Other structures and configurations of the layout 900 are within the scope of the present disclosure. Well regions 924A, 924B, 924C are defined below the active region rows 205A, 205B, 205C, 205D, 205E, 205F, 205G, 205H, 205I, 205J, 205K, 205L according to the conductivity type of the devices in the elements of the peripheral logic circuit 800 represented in the layout 900. In some embodiments, the well regions 924A, 924B, 924C comprise n-type well regions.

The number and arrangement of active region rows 205A, 205B, 205C, 205D, 205E, 205F, 205G, 205H, 205I, 205J, 205K, 205L provide flexibility in locating the power headers 822, 922A, 922B, 922C. Power headers 822 may be provided in any of the active region rows 205A, 205B, 205C, 205D, 205E, 205F, 205G, 205H, 205I, 205J, 205K, 205L, thereby allowing a power header to be located near the device it serves. For example, the power header 922A is located near the write drivers 902A, 902B, 902C, which typically consume a significant amount of power in the peripheral logic circuit 800.

Figure 10:
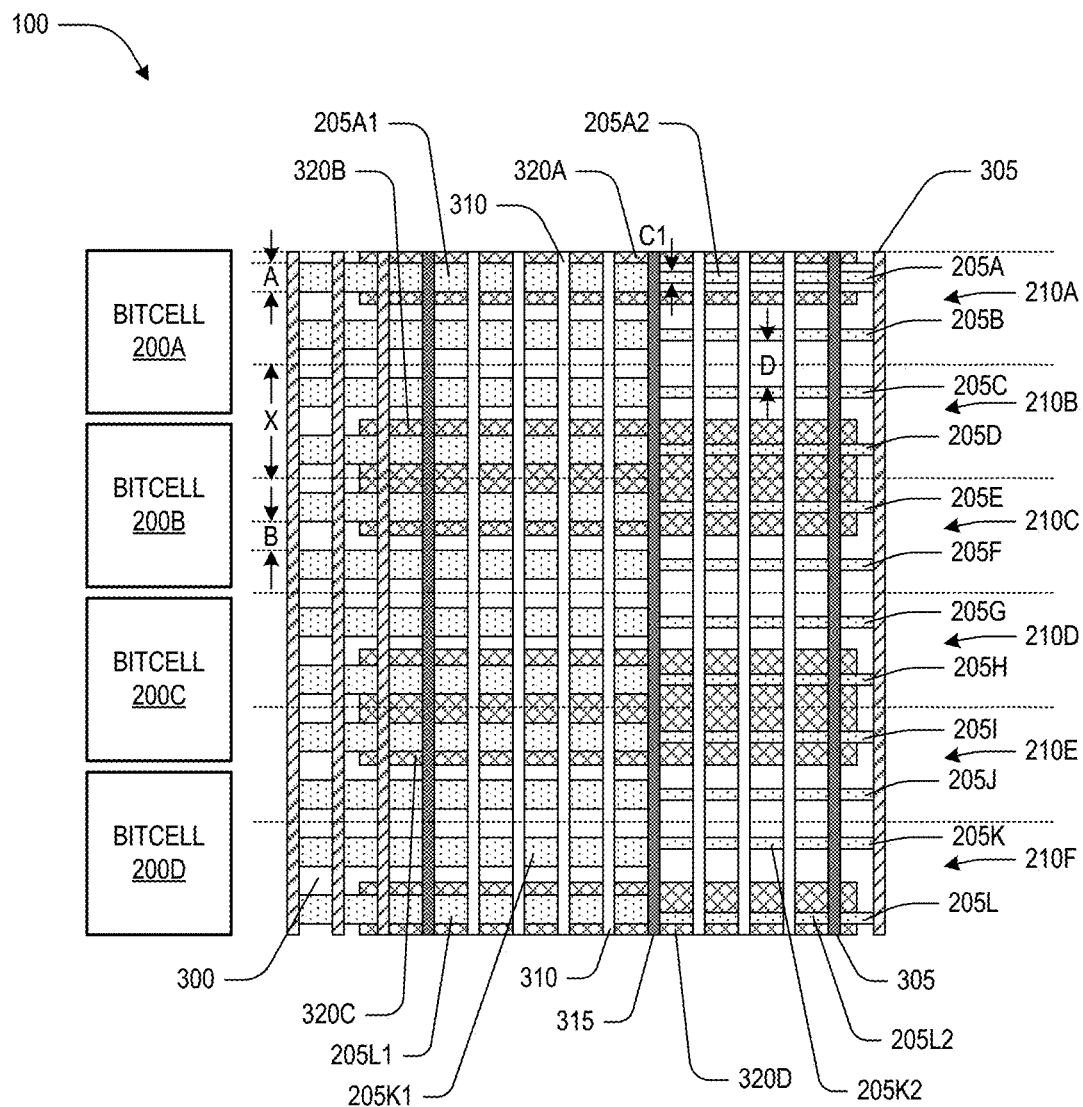
FIG. 10 is a top view of a semiconductor arrangement, in accordance with some embodiments.

Referring to FIG. 10, a top view of the semiconductor arrangement 100 comprising axially aligned active region rows having different widths is provided, according to some embodiments. The active region rows 205A, 205B, 205C, 205D, 205E, 205F, 205G, 205H, 205I, 205J, 205K, 205L comprise a first portion 205A1, 205K1, 205L1 having a first width, A, and a second portion 205A2, 205K2, 205L2 having a second width, C1, less than the first width, A. For ease of illustration the two portions are not separately numbered for each active region row 205A, 205B, 205C, 205D, 205E, 205F, 205G, 205H, 205I, 205J, 205K, 205L. In some embodiments, a diffusion break structure 315 is provided to physically and electrically separate the first portions 205A1, 205K1, 205L1 from the second portions 205A2, 205K2, 205L2. In some embodiments, a spacing, D, between the second portions 205A2, 205K2, 205L2 is greater than the spacing, B, between the first portions 205A1, 205K1, 205L1. In some embodiments, the dimension, C1, is about 10-32 nm. In some embodiments, the dimension, D, is about 39-74 nm. Other values, ranges, etc. of C1 and/or D are within the scope of the present disclosure.

Due to the reduced width of the second portions 205A2, 205K2, 205L2, the leakage current associated with devices formed from the second portions 205A2, 205K2, 205L2 is reduced as compared to the leakage current associated with devices formed from portions that do not have such reduced width. In some embodiments, such as illustrated for portions 205A1 and 205A2, the first portions and second portions are center aligned. In some embodiments, such as illustrated for portions 205K1 and 205K2, the first portions and second portions are top edge aligned. In some embodiments, such as illustrated for portions 205L1 and 205L2, the first portions and second portions are bottom edge aligned. Other configurations for the alignment of the first portions and second portions are within the scope of the present disclosure. Typically, the alignment (center, top edge, or bottom edge) of the first portions and the second portions would be the same for all of the active region rows 205A, 205B, 205C, 205D, 205E, 205F, 205G, 205H, 205I, 205J, 205K, 205L. The different alignments of the first portions 205A1, 205K1, 205L1 and the second portions 205A2, 205K2, 205L2 in the same layout are provided for illustration purposes.

Figure 11:
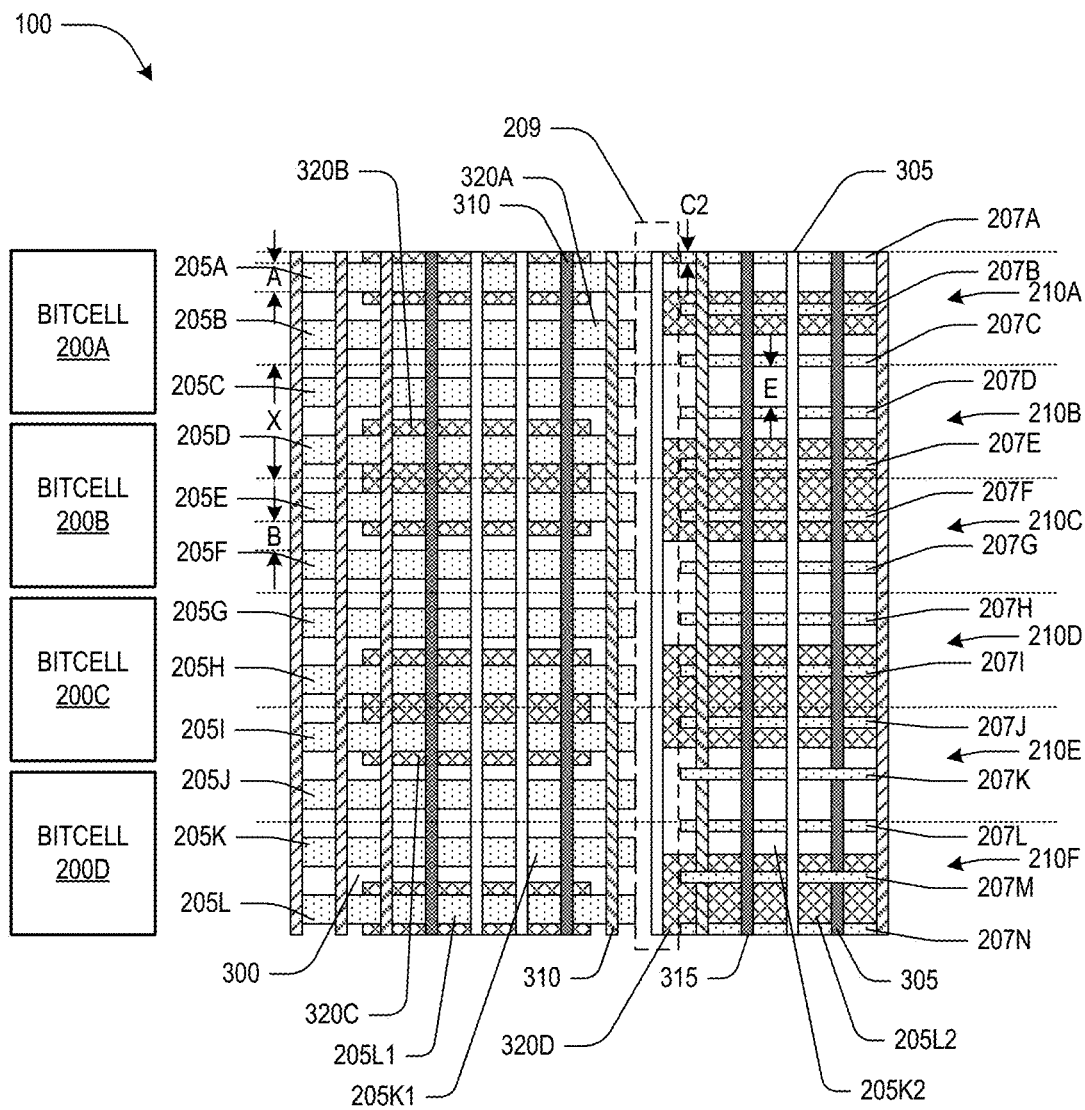
FIG. 11 is a top view of a semiconductor arrangement, in accordance with some embodiments.

Referring to FIG. 11, a top view of the semiconductor arrangement 100 comprising groups of active region rows having different widths is provided, according to some embodiments. Active region rows 207A, 207B, 207C, 207D, 207E, 207F, 207G, 207H, 207I, 207J, 207K, 207L, 207M, 207N are positioned adjacent the active region rows 205A, 205B, 205C, 205D, 205E, 205F, 205G, 205H, 205I, 205J, 205K, 205L. The active region rows 207A, 207B, 207C, 207D, 207E, 207F, 207G, 207H, 207I, 207J, 207K, 207L, 207M, 207N have a width, C2, less than the first width, A. In some embodiments, a spacing, E, between the active region rows 207A, 207B, 207C, 207D, 207E, 207F, 207G, 207H, 207I, 207J, 207K, 207L, 207M, 207N is greater than the spacing, B, between the active region rows 205A, 205B, 205C, 205D, 205E, 205F, 205G, 205H, 205I, 205J, 205K, 205L. In some embodiments, an EUV patterning process is performed to define an end cut region 209 between the active region rows 205A, 205B, 205C, 205D, 205E, 205F, 205G, 205H, 205I, 205J, 205K, 205L and the active region rows 207A, 207B, 207C, 207D, 207E, 207F, 207G, 207H, 207I, 207J, 207K, 207L, 207M, 207N. In some embodiments, the dimension, C2, is about 10-32 nm. In some embodiments, the dimension, E, is about 39-74 nm. Other values, ranges, etc. of C2 and/or E are within the scope of the present disclosure. In some embodiments, the active region rows 205A, 205B, 205C, 205D, 205E, 205F, 205G, 205H, 205I, 205J, 205K, 205L having the first width A are adjacent one another without other intervening active region areas, and the active region rows 207A, 207B, 207C, 207D, 207E, 207F, 207G, 207H, 207I, 207J, 207K, 207L, 207M, 207N having the second width C2 are adjacent one another without other intervening active region areas.

Due to the reduced width of the active region rows 207A, 207B, 207C, 207D, 207E, 207F, 207G, 207H, 207I, 207J, 207K, 207L, 207M, 207N, the leakage current associated with devices formed from the active region rows 207A, 207B, 207C, 207D, 207E, 207F, 207G, 207H, 207I, 207J, 207K, 207L, 207M, 207N is reduced as compared to the leakage current associated with devices formed from active region rows that do not have such reduced width.

In some embodiments, the second portions 205A2, 205K2, 205L2 in FIG. 10 or the active region rows 207A, 207B, 207C, 207D, 207E, 207F, 207G, 207H, 207I, 207J, 207K, 207L, 207M, 207N in FIG. 11 are used to implement elements of the peripheral logic circuit 800 that are less speed-critical or are not in a driver path. For example, the write assist circuit 806, the BIST/Data input circuit 808, and/or the column redundancy circuit 820 may be implemented using the second portions 205A2, 205K2, 205L2 in FIG. 10 or the active region rows 207A, 207B, 207C, 207D, 207E, 207F, 207G, 207H, 207I, 207J, 207K, 207L, 207M, 207N in FIG. 11 to reduce leakage current, and thus reduce power consumption of the peripheral logic circuit 800.

Figure 12:
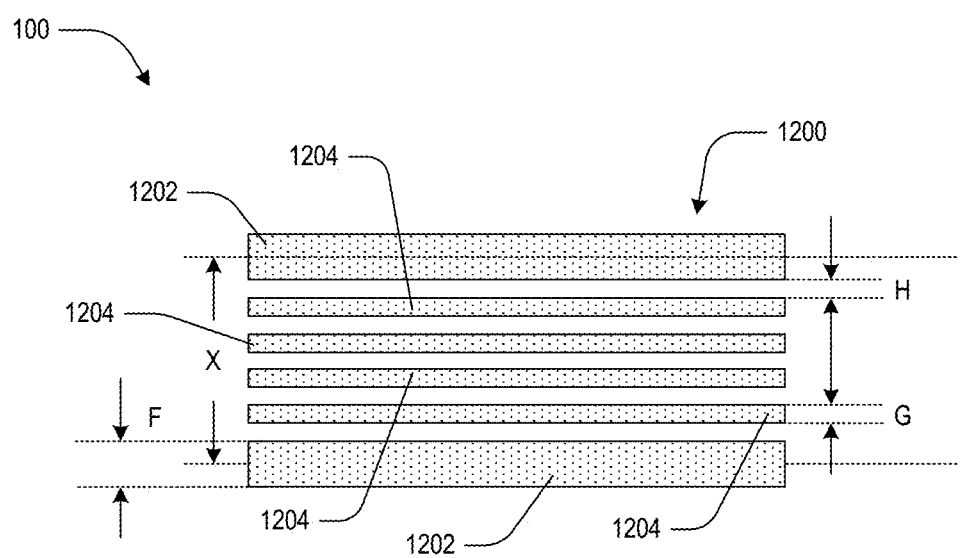
FIG. 12 is a top view of a semiconductor arrangement, according to some embodiments.

Referring to FIG. 12, a top view of a metallization layer 1200 of the semiconductor arrangement 100 is provided, according to some embodiments. In some embodiments, the metallization layer comprises a first metallization layer, M0, formed over a device layer of the semiconductor arrangement 100. The metallization layer 1200 comprises conductive power plane lines 1202 having widths, F, and conductive signal lines 1204 having widths, G. For example, the conductive power plane lines 1202 are connected to the power headers 922A, 922B, 922C shown in FIG. 9, and the conductive signal lines 1204 are used to contact gates or source/drain regions of underlying devices. In some embodiments, a spacing, H, is defined between the conductive lines 1202, 1204. In some embodiments, a pitch defined by the spacing, H, is uniform, thereby tending to increase yield. In some embodiments, the dimension, X, represents the width of a peripheral logic block 210A, 210B, as shown in FIG. 3. In some embodiments, four conductive signal lines 1204 are provided for the peripheral logic block 210A. In some embodiments, the dimension, F, is about 28-38 nm. In some embodiments, the dimension, G, is about 13-14 nm. In some embodiments, the dimension, H, is about 10 nm. Other values, ranges, etc. of F, G, and/or H are within the scope of the present disclosure.

Figure 13:
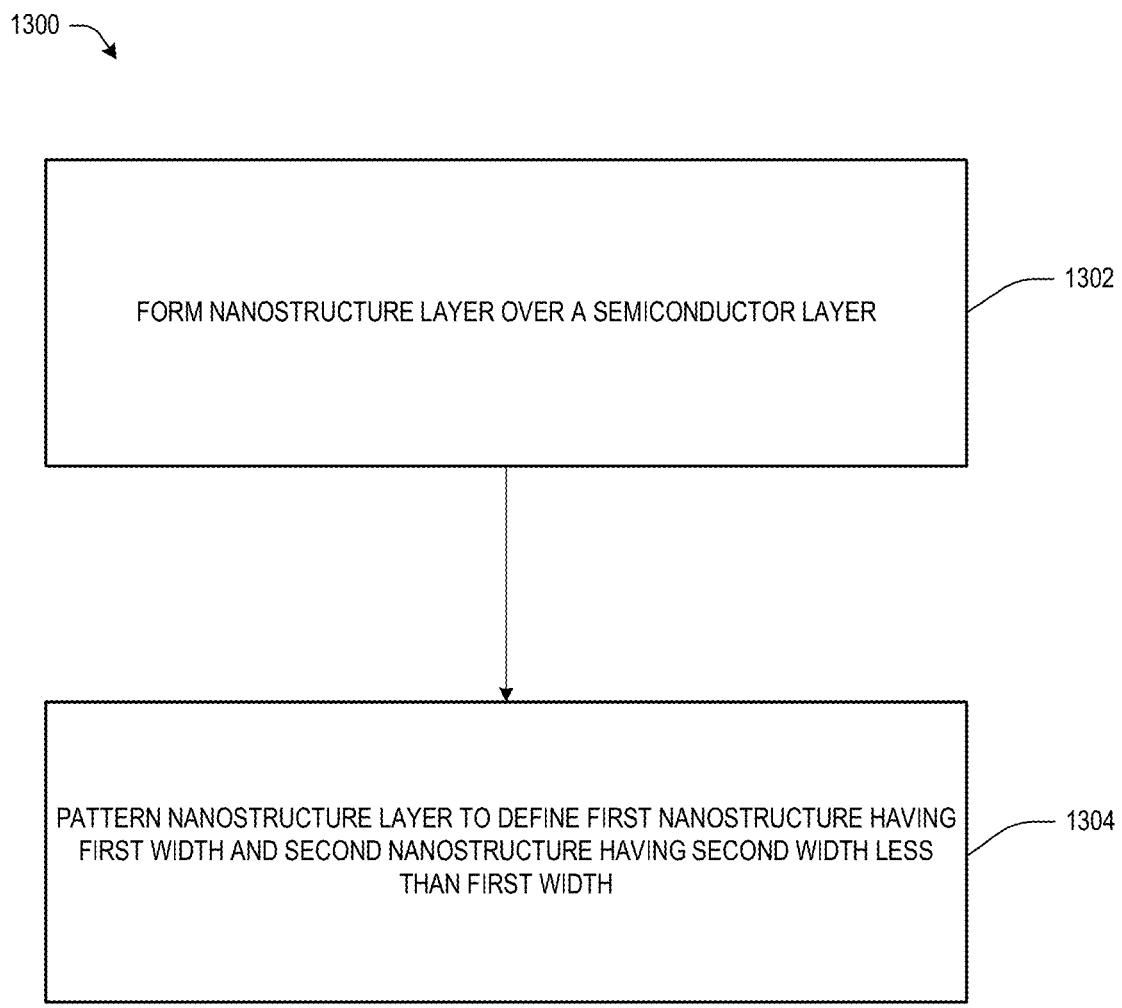
FIG. 13 is a flow chart illustrating a method for forming a semiconductor arrangement, in accordance with some embodiments.

FIG. 13 is a flow diagram illustrating a method 1300 for forming a semiconductor arrangement 100, in accordance with some embodiments. At 1302, a nanostructure layer is formed over a semiconductor layer 300. At 1304, the nanostructure layer is patterned to define a first nanostructure 205A, 205A1, 205B, 205C, 205D, 205E, 205F, 205G, 205H, 205I, 205J, 205K, 205K1, 205L, 205L1 having a first width, A, and a second nanostructure 205A2, 205K2, 205L2, 207A, 207B, 207C, 207D, 207E, 207F, 207G, 207H, 207I, 207J, 207K, 207L, 207M, 207N having a second width, C1, C2 less than the first width, A. In some embodiments, a first portion of peripheral logic is formed from the first nanostructure and/or a second portion of peripheral logic is formed from the second nanostructure. In some embodiments, the peripheral logic is used to access a memory array.

Figure 14:
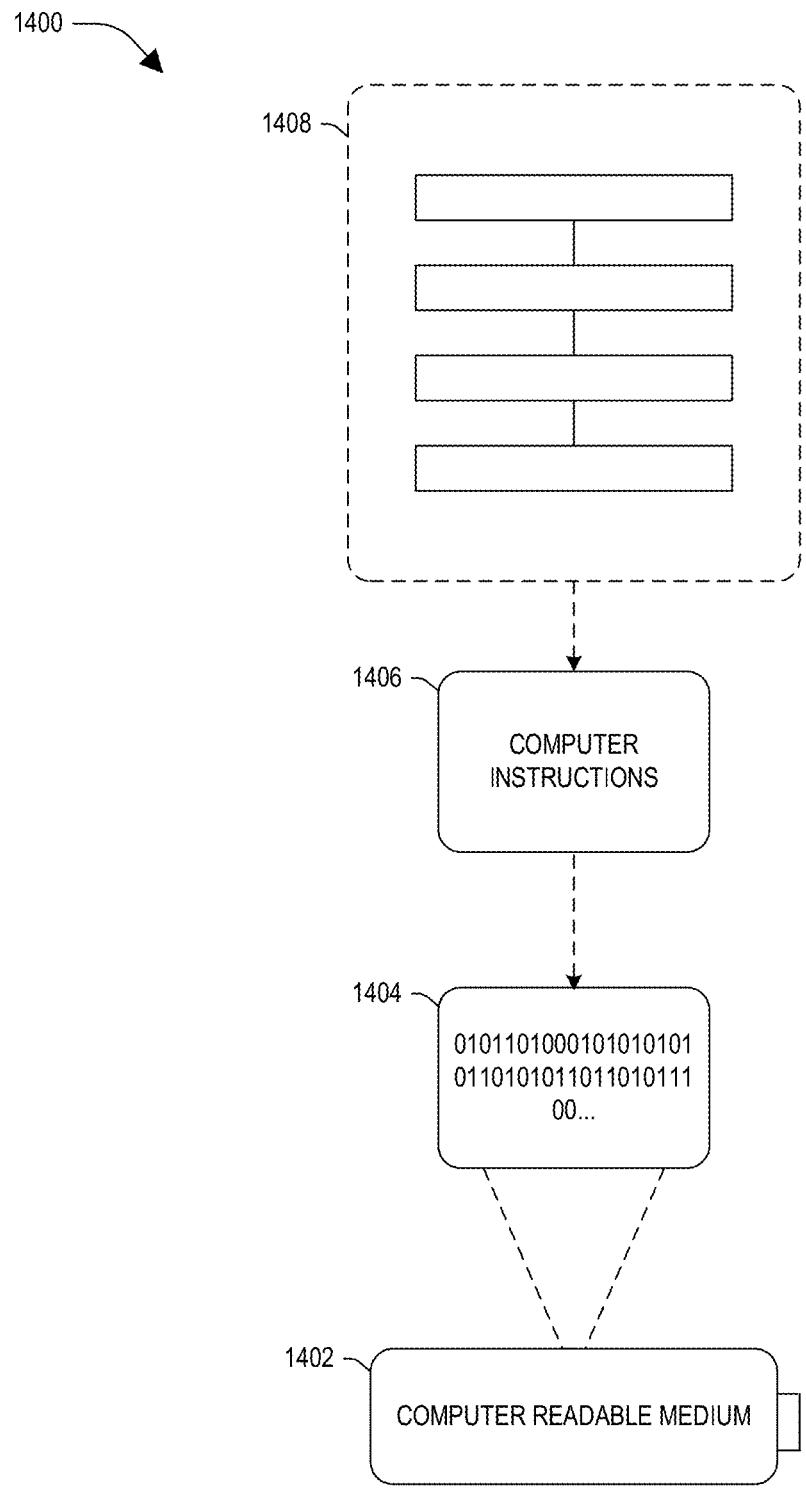
FIG. 14 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 14, wherein the embodiment 1400 comprises a computer-readable medium 1402 (e.g., a CD-R, DVD-R, flash drive, a platter of a hard disk drive, etc.), on which is encoded computer-readable data 1404. This computer-readable data 1404 in turn comprises a set of processor-executable computer instructions 1406 configured to operate according to one or more of the principles set forth herein. In some embodiments 1400, the processor-executable computer instructions 1406 are configured to perform a method 1408, such as at least some of the aforementioned described methods. In some embodiments, the processor-executable computer instructions 1406 are configured to implement a system, such as at least some of the aforementioned systems. Many such computer-readable media may be devised by those of ordinary skill in the art that are configured to operate in accordance with the techniques presented herein.

Figure 15:
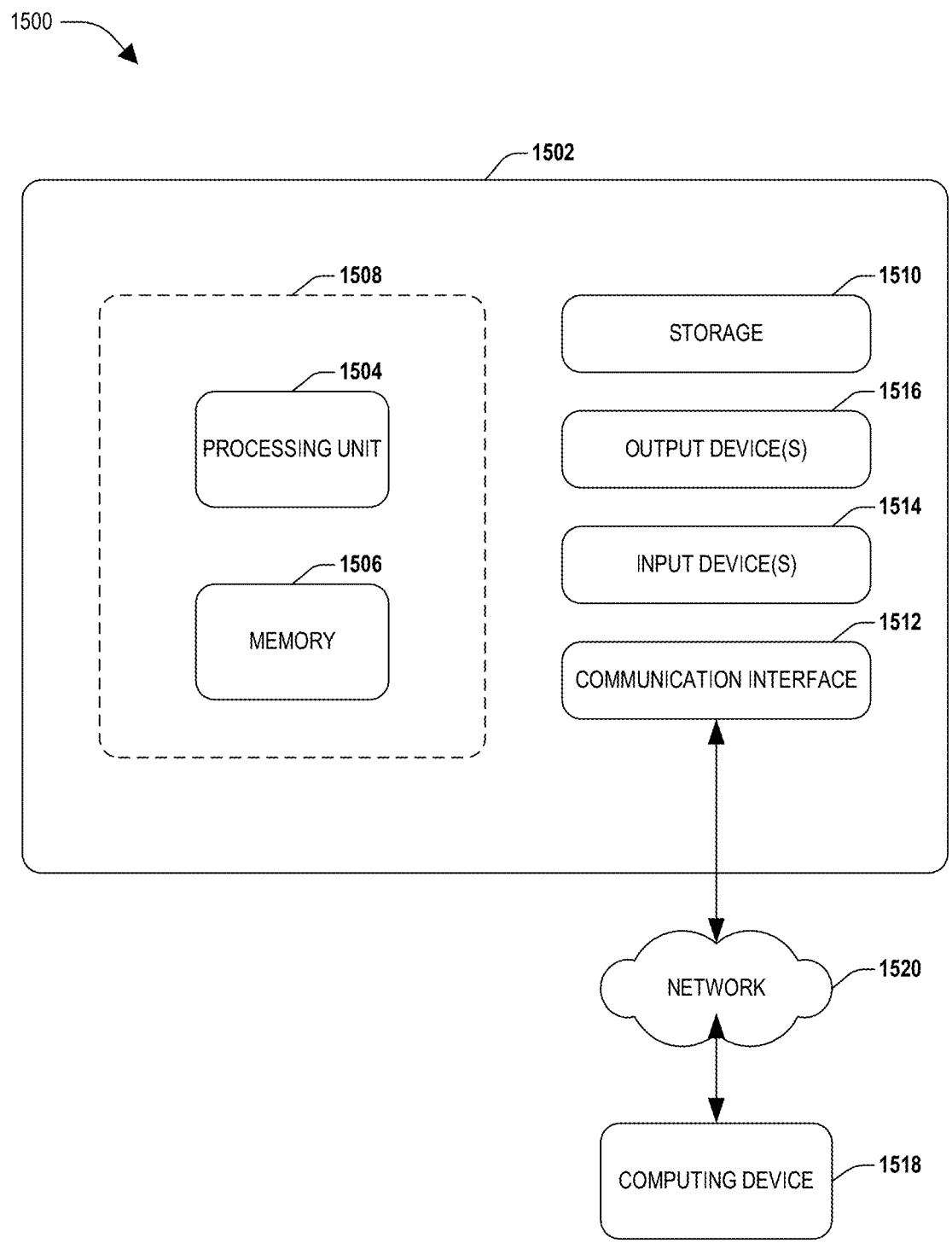
FIG. 15 illustrates an example computing environment wherein one or more of the provisions set forth herein may be implemented, in accordance with some embodiments.

FIG. 15 and the following discussion provide a brief, general description of a suitable computing environment to implement embodiments of one or more of the provisions set forth herein. The operating environment of FIG. 15 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 15 depicts an example of a system 1500 comprising a computing device 1502 to implement some embodiments provided herein. In some configurations, computing device 1502 includes at least one processing unit 1504 and memory 1506. Depending on the exact configuration and type of computing device, the memory 1506 may be volatile (such as RAM, for example), non-volatile (such as ROM, flash memory, etc., for example) or some combination of the two. This configuration is illustrated in FIG. 15 by dashed line 1508.

In some embodiments, the computing device 1502 may include additional features and/or functionality. For the example, the computing device 1502 may also include additional storage (e.g., removable and/or non-removable) including, but not limited to, magnetic storage, optical storage, and the like. Such additional storage is illustrated in FIG. 15 by storage 1510. In some embodiments, computer readable instructions to implement one or more embodiments provided herein may be in the storage 1510. The storage 1510 may also store other computer readable instructions to implement an operating system, an application program, and the like. Computer readable instructions may be loaded in the memory 1506 for execution by processing unit 1504, for example.

The term "computer readable media" as used herein includes computer storage media. Computer storage media includes volatile and nonvolatile, removable and non-removable media implemented in any method or technology for storage of information such as computer readable instructions or other data. The memory 1506 and storage 1510 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by the computing device 1502. Any such computer storage media may be part of the computing device 1502.

In some embodiments, the computing device 1502 comprises a communication interface 1512, or a multiple communication interfaces, that allow the computing device 1502 to communicate with other devices. The communication interface 1512 may include, but is not limited to, a modem, a Network Interface Card (NIC), an integrated network interface, a radio frequency transmitter/receiver, an infrared port, a Universal Serial Bus (USB) connection, or other interface for connecting the computing device 1502 to other computing devices. The communication interface 1512 may implement a wired connection or a wireless connection. The communication interface 1512 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 1502 may include input device(s) 1514 such as keyboard, mouse, pen, voice input device, touch input device, infrared cameras, video input devices, and/or any other suitable input device. An output device(s) 1516 such as one or more displays, speakers, printers, and/or any other suitable output device may also be included in the computing device 1502. The input device 1514 and the output device 1516 may be connected to the computing device 1502 via a wired connection, wireless connection, or any combination thereof. In some embodiments, an input device or an output device from another computing device may be used as the input device(s) 1514 or the output device(s) 1516 for the computing device 1502.

Components of the computing device 1502 may be connected by various interconnects, such as a bus. Such interconnects may include a Peripheral Component Interconnect (PCI), such as PCI Express, a USB, firewire (IEEE 1394), an optical bus structure, and the like. In some embodiments, components of the computing device 1502 may be interconnected by a network. For example, the memory 1506 may be comprised of multiple physical memory units located in different physical locations interconnected by a network.

Those skilled in the art will realize that storage devices utilized to store computer readable instructions may be distributed across a network. For example, a computing device 1518 accessible via a network 1520 may store computer readable instructions to implement one or more embodiments provided herein. The computing device 1502 may access the computing device 1518 and download a part or all of the computer readable instructions for execution.

Alternatively, the computing device 1502 may download pieces of the computer readable instructions, as needed, or some instructions may be executed at the computing device 1502 and some instructions may be executed at the computing device 1518.

According to some embodiments, a semiconductor arrangement includes a memory array including bitcells and a peripheral logic block for accessing the bitcells. The peripheral logic block includes a first nanostructure having a first width for providing power to a first logic unit of the peripheral logic block, and a second nanostructure axially aligned with the first nanostructure and having a second width less than the first width for providing power to a second logic unit of the peripheral logic block.

According to some embodiments, a semiconductor arrangement includes a memory array including bitcells and a peripheral logic block for accessing the bitcells. The peripheral logic block includes a first nanostructure having a first width for providing power to a first logic unit of the peripheral logic block, a second nanostructure having a second width less than the first width for providing power to a second logic unit of the peripheral logic block, a third nanostructure having the first width and adjacent the first nanostructure, and a fourth nanostructure having the second width and adjacent the second nanostructure.

According to some embodiments, a method of forming a semiconductor arrangement includes forming a nanostructure layer over a semiconductor layer. The nanostructure layer is patterned to define a first nanostructure having a first width and a second nanostructure having a second width less than the first width.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a memory array comprising bitcells; and
   a peripheral logic block for accessing the bitcells, comprising:
      a first nanostructure having a first width for providing power to a first logic unit of the peripheral logic block; and
      a second nanostructure axially aligned with the first nanostructure and having a second width less than the first width for providing power to a second logic unit of the peripheral logic block.

2. The semiconductor arrangement of claim 1, wherein the peripheral logic block comprises twelve nanostructures including the first nanostructure and the second nanostructure, associated with four bitcells of the memory array.

3. The semiconductor arrangement of claim 1, comprising:
   a third nanostructure adjacent the first nanostructure formed over a first semiconductor layer having a first conductivity type, wherein the first nanostructure is formed over a second semiconductor layer having a second conductivity type different than the first conductivity type.

4. The semiconductor arrangement of claim 3, wherein:
   the first nanostructure comprises a header transistor comprising a first gate and a first source/drain region coupled to a power supply terminal;
   the third nanostructure comprises a logic device for reading values stored in the bitcells, the logic device comprising a second gate and a second source/drain region; and
   the semiconductor arrangement comprises:
      a source/drain contact connected to the first source/drain region and the second source/drain region to provide a power signal received by the header transistor at the power supply terminal to the logic device.

5. The semiconductor arrangement of claim 3, wherein:
   the first nanostructure comprises a header transistor comprising a first gate and a first source/drain region coupled to a power supply terminal;
   the third nanostructure comprises a logic device for reading values stored in the bitcells, the logic device comprising a second gate and a second source/drain region; and
   the semiconductor arrangement comprises:
      a first source/drain contact connected to the first source/drain region;
      a second source/drain contact connected to the second source/drain region; and
      a conductive line connected to the first source/drain contact and the second source/drain contact to provide a power signal received by the header transistor at the power supply terminal to the logic device.

6. The semiconductor arrangement of claim 1, wherein the first nanostructure and the second nanostructure are center aligned.

7. The semiconductor arrangement of claim 1, wherein the first nanostructure and the second nanostructure are edge aligned.

8. The semiconductor arrangement of claim 1, wherein:
   the first logic unit comprises at least one of a write driver, write logic, a read column multiplexer, a sense amplifier, data output circuitry, or a pre-charge/equalization circuit; and
   the second logic unit comprises at least one of a write assist circuit, a built-in self-test/data input circuit, or a column redundancy circuit.

9. The semiconductor arrangement of claim 1, comprising:
   a diffusion break structure between the first nanostructure and the second nanostructure.

10. The semiconductor arrangement of claim 9, wherein the diffusion break structure comprises a dielectric material.

11. The semiconductor arrangement of claim 9, comprising:
   a first gate structure over the first nanostructure; and
   a second gate structure over the second nanostructure, wherein the diffusion break structure is parallel to the first gate structure and the second gate structure.

12. A semiconductor arrangement, comprising:
   a memory array comprising bitcells; and
   a peripheral logic block for accessing the bitcells, comprising:
      a first nanostructure having a first width for providing power to a first logic unit of the peripheral logic block;

a second nanostructure having a second width less than the first width for providing power to a second logic unit of the peripheral logic block;
a third nanostructure having the first width and adjacent the first nanostructure; and
a fourth nanostructure having the second width and adjacent the second nanostructure.

13. The semiconductor arrangement of claim 12, wherein:
the first nanostructure and the second nanostructure have a first spacing; and
the second nanostructure and the fourth nanostructure have a second spacing different than the first spacing.

14. The semiconductor arrangement of claim 12, wherein:
the first logic unit comprises at least one of column select logic, write driver logic, write column select logic, sense amplifier logic, or data driver logic; and
the second logic unit comprises at least one of column redundancy logic, built-in self-test logic, data input logic, or write assist logic.

15. A semiconductor arrangement, comprising:
a memory array comprising bitcells; and
a peripheral logic block for accessing the bitcells, comprising:
   a well region having a longest dimension extending in a first direction;
   a first active region row overlying the well region and having a longest dimension extending in the first direction; and
   a diffusion break structure overlying the first active region row and extending in a second direction, wherein:
      a first portion of the first active region row on a first side of the diffusion break structure has a first width measured in the second direction,
      a second portion of the first active region row on a second side of the diffusion break structure opposite the first side has a second width measured in the second direction, and
      the second width is smaller than the first width.

16. The semiconductor arrangement of claim 15, comprising:
a gate structure overlying the first active region row on the first side of the diffusion break structure, wherein the gate structure has a longest dimension extending in the second direction.

17. The semiconductor arrangement of claim 16, comprising:
a dummy gate structure overlying the first active region row on the second side of the diffusion break structure, wherein the dummy gate structure has a longest dimension extending in the second direction.

18. The semiconductor arrangement of claim 15, comprising:
a dummy gate structure overlying the first active region row on the second side of the diffusion break structure.

19. The semiconductor arrangement of claim 15, comprising:
a second active region row extending in the first direction, wherein:
   the diffusion break structure overlies the second active region row,
   a first portion of the second active region row on the first side of the diffusion break structure has a third width measured in the second direction,
   a second portion of the second active region row on the second side of the diffusion break structure has a fourth width measured in the second direction, and
   the fourth width is different than the third width.

20. The semiconductor arrangement of claim 19, wherein:
the first portion of the first active region row is spaced apart from the first portion of the second active region row by a first spacing measured in the second direction,
the second portion of the first active region row is spaced apart from the second portion of the second active region row by a second spacing measured in the second direction, and
the first spacing is less than the second spacing.

* * * * *